United States Patent
Kawata

[19]

[11] Patent Number: 6,157,061
[45] Date of Patent: *Dec. 5, 2000

[54] NONVOLATILE SEMICONDUCTOR MEMORY DEVICE AND METHOD OF MANUFACTURING THE SAME

[75] Inventor: Masato Kawata, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/141,324

[22] Filed: Aug. 27, 1998

[30] Foreign Application Priority Data

Aug. 29, 1997 [JP] Japan .................................. 9-233874

[51] Int. Cl.[7] .......................... H01L 29/76; H01L 29/788
[52] U.S. Cl. ........................... 257/316; 257/314; 257/315
[58] Field of Search .................................... 257/314–324, 257/331; 438/257–264

[56] References Cited

U.S. PATENT DOCUMENTS

| | | | |
|---|---|---|---|
| 4,774,556 | 9/1988 | Fujii et al. | 257/321 |
| 5,258,634 | 11/1993 | Yang | 257/331 |
| 5,338,953 | 8/1994 | Wake | 257/331 |
| 5,350,937 | 9/1994 | Yamazaki et al. | 257/331 |

FOREIGN PATENT DOCUMENTS

| | | |
|---|---|---|
| 62-25459 | 2/1987 | Japan . |
| 62-98778 | 5/1987 | Japan . |
| 64-20668 | 1/1989 | Japan . |
| 1-104775 | 6/1989 | Japan . |
| 6-13627 | 1/1994 | Japan . |
| 6-77498 | 3/1994 | Japan . |
| 6-318712 | 11/1994 | Japan . |
| 7-115142 | 5/1995 | Japan . |
| 7-226449 | 8/1995 | Japan . |
| 408162547A | 6/1996 | Japan . |
| 8-148587 | 6/1996 | Japan . |
| 8-2888411 | 11/1996 | Japan . |

Primary Examiner—Minh Loan Tran
Assistant Examiner—Cuong Quang Nguyen
Attorney, Agent, or Firm—Sughrue, Mion, Zinn, Macpeak & Seas, PLLC

[57] ABSTRACT

A nonvolatile semiconductor memory device includes a vertical memory cell. The memory cell is constituted by at least a channel portion, a drain and a source, first and second floating gates, and a control gate. The channel portion is vertically formed on a semiconductor substrate. The drain and the source are formed at upper and lower positions of the channel portion to form a channel in the channel portion. The first floating gate is formed on part of a side portion of the channel portion via a gate insulating film. The second floating gate is formed on the side portion of the channel portion in a region without the first floating gate. The control gate is formed outside the first and second floating gates via an insulating isolation film. A method of manufacturing the nonvolatile semiconductor memory device is also disclosed.

12 Claims, 9 Drawing Sheets

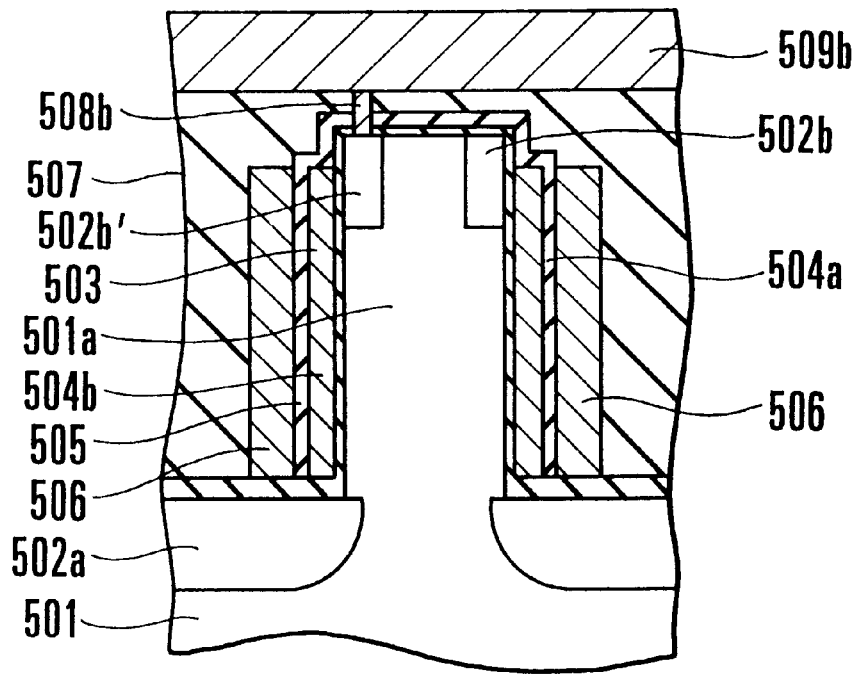
F I G. 4A
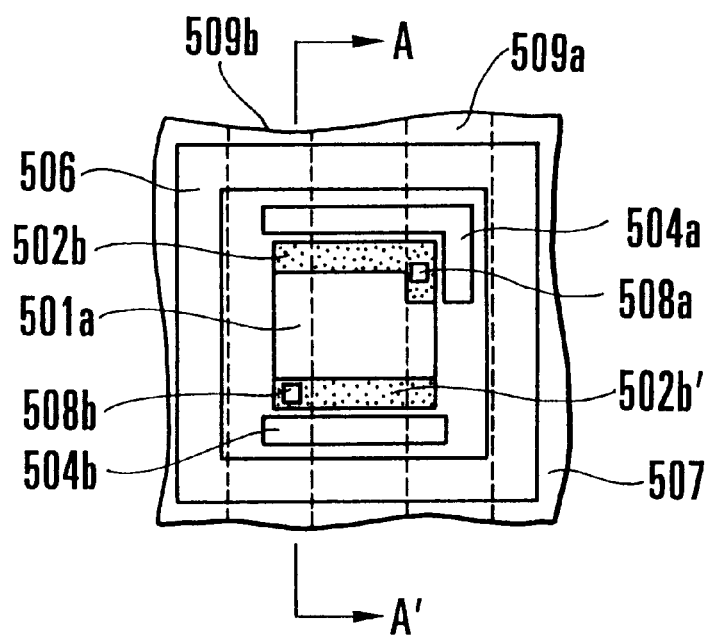
F I G. 4B

NONVOLATILE SEMICONDUCTOR MEMORY DEVICE AND METHOD OF MANUFACTURING THE SAME

BACKGROUND OF THE INVENTION

The present invention relates to a nonvolatile semiconductor memory device having memory cells allowing an electrical data write and erase.

Conventionally, a flash memory which can be erased in blocks has received a great deal of attention as one of electrically programmable and erasable read only memories (EEPROMs) which are classified as one of nonvolatile semiconductor memories. The flash memory cell has a MOS transistor structure wherein a floating gate insulated from the peripheral region is formed between the control gate and the substrate having the channel. Discrimination between data of level "1" and data of level "0" depends on the presence/absence of charges in the floating gate.

FIGS. 8A and 8B show such a flash memory cell having a transistor structure wherein a channel region is formed around the side wall of a vertical silicon column.

In this flash memory cell, a columnar portion (pillar) 1102 is formed on a p-type semiconductor substrate 1101. A drain 1103 is formed at the upper portion of the pillar 1102, and a source 1104 is formed in the semiconductor substrate 1101 under the pillar 1102.

A floating gate 1106 is formed on the side wall of the pillar 1102 via a gate insulating film 1105. A control gate 1108 is formed around the floating gate 1106 via an insulating film 1107. An interconnection 1110 as a bit line is connected to the drain 1103 through an insulating interlayer 1109.

When the source and the drain are formed under and at the upper portion of the columnar portion, respectively, and the floating gate and the control gate are formed on the side wall portion of the columnar portion, the two-dimensional size of the cell can be reduced while increasing the read current, so the degree of integration of the memory cell can be improved.

In the above-described vertical-type flash memory cell, however, only "0" or "1" can be stored in one memory transistor. To increase the amount of information to be stored, the number of memory cells must be increased, so the degree of integration cannot increase.

Conventionally, a technique of realizing multilevel data by a circuit operation is used. Such a technique realizes, e.g., quarternary data by changing the amount of charges stored in the floating gate.

In this case, however, the number of power supplies necessary for realizing multilevel data increases to result in a heavy load on, e.g., a charge pump circuit. The necessity for such a circuit also impedes high integration.

Additionally, to realize multilevel data by the circuit operation, a threshold value range per level must be considerably narrow. For this reason, the amount of charges to be injected into the floating gate must be strictly controlled to result in an increase in load on the controller or write time. This narrow threshold value range also imposes limitations on the margin to a change over time in data holding characteristics to lower reliability. More specifically, when the held charge amount changes along with the elapse of time, the read current changes accordingly, and a data value different from that stored is read.

SUMMARY OF THE INVENTION

It is an object of the present invention to realize higher integration of a nonvolatile semiconductor memory device while making it stably operate without lowering the data holding reliability.

In order to achieve the above object, according to the present invention, there is provided a nonvolatile semiconductor memory device comprising a vertical memory cell constituted by at least a channel portion vertically formed on a semiconductor substrate, a drain and source formed at upper and lower positions of the channel portion to form a channel in the channel portion, a first floating gate formed on part of a side portion of the channel portion via a gate insulating film, a second floating gate formed on the side portion of the channel portion in a region without the first floating gate, and a control gate formed outside the first and second floating gates via an insulating isolation film.

BRIEF DESCRIPTION OF THE DRAWINGS

FIGS. 4A and 4B are sectional and plan views, respectively, schematically showing the structure of a nonvolatile semiconductor memory device according to the second embodiment of the present invention;

DESCRIPTION OF THE PREFERRED EMBODIMENTS

The embodiments of the present invention will be described below with reference to the accompanying drawings.

First Embodiment

Figure 1:
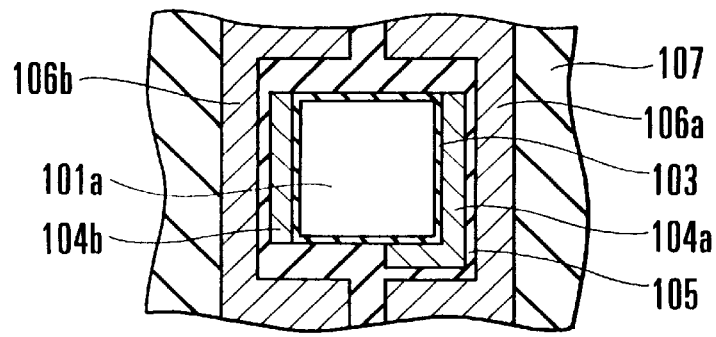
FIG. 1 is a cross-sectional view schematically showing the structure of a nonvolatile semiconductor memory device according to the first embodiment of the present invention.

FIG. 1 schematically shows the structure of a nonvolatile semiconductor memory device according to the first embodiment of the present invention when viewed from the upper side. FIG. 1 shows one memory cell of the nonvolatile semiconductor memory device.

In the first embodiment, as shown in FIG. 1, a gate insulating film 103 is formed around a columnar portion (pillar: channel portion) 101*a*, and floating gates 104*a* and 104*b* are formed on the side surfaces of the gate insulating film 103. In the first embodiment, the floating gate 104*a* has a larger area than the floating gate 104*b*.

Control gates 106*a* and 106*b* serving as word lines are formed around the floating gates 104*a* and 104*b*, respectively, via an insulating isolation film 105. The control gates 106a and 106b are covered with an insulating interlayer 107.

A method of manufacturing the memory cell will be described below

Figures 2A, 2B:
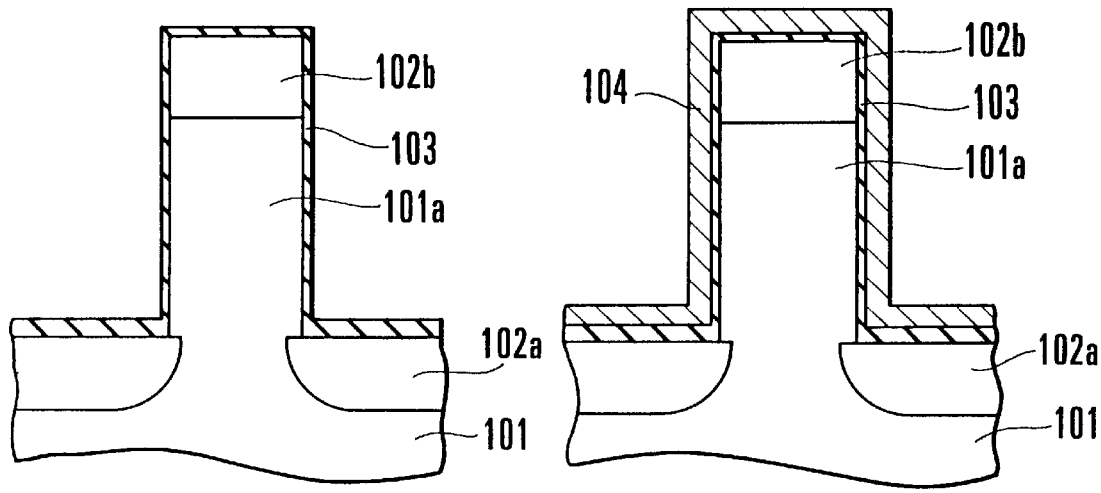
FIGS. 2A to 2G are explanatory views showing a method of manufacturing the nonvolatile semiconductor memory device according to the first embodiment of the present invention.

As shown in FIG. 2A, a p-type semiconductor substrate 101 is, e.g., dry-etched to form a pillar 101a on the substrate, and then, e.g., As is ion-implanted at 70 keV and $5 \times 10^{15}$ cm$^{-2}$ to form a source 102a and a drain 102b. After ion implantation, the resultant structure is heated to 950° C. in a vapor atmosphere to form an oxide film having a thickness of about 40 nm. With this process, the source 102a and the drain 102b, each having an impurity concentration of about $10^{20}$ cm$^{-3}$, are formed.

After the oxide film is removed, the structure is heated to 850° C. in the vapor atmosphere to form a gate insulating film 103 having a thickness of about 10 nM.

Next, as shown in FIG. 2B, polysilicon is deposited on the gate insulating film 103 to a thickness of about 150 nm by CVD. The resultant structure is heated to about 850° C. in a POCl$_3$ atmosphere to diffuse P, thereby forming a polysilicon film 104 doped with P as an impurity.

Figure 2C:
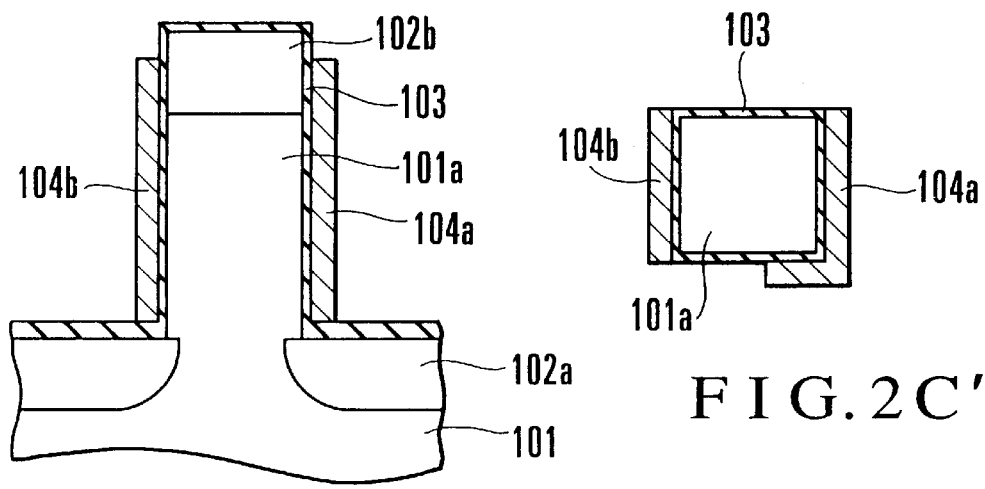

A resist mask is formed by known photolithography. The polysilicon film 104 is selectively removed by anisotropic etching such as RIE to form the floating gates 104a and 104b on the side surfaces of the pillar 101a via the gate insulating film 103, as shown in FIG. 2C. When viewed from the upper side, the floating gate 104a has a larger area than the floating gate 104b, as shown in FIG. 2C'.

Figures 2D, 2E:
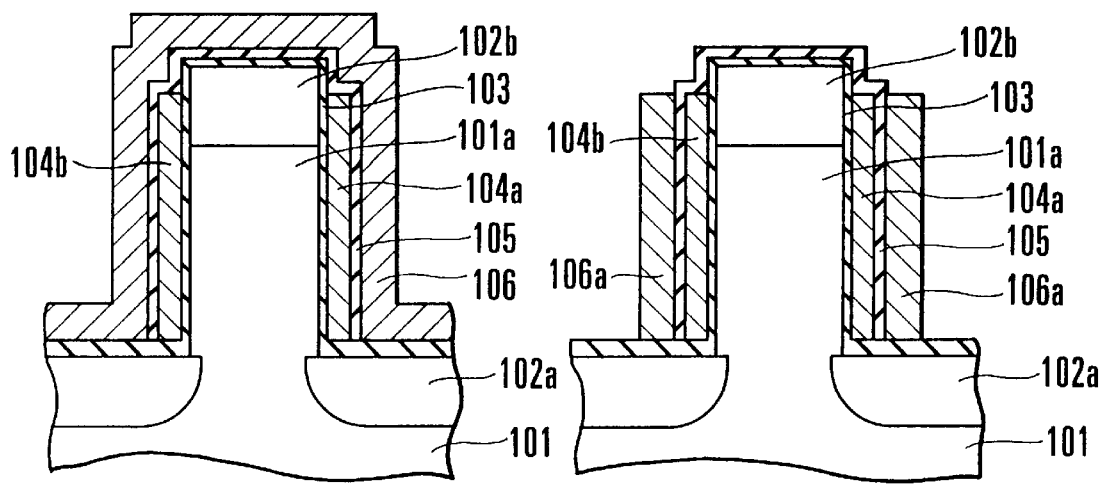
Figure 2E:
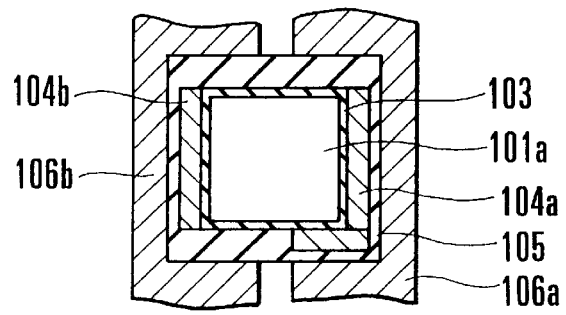

As shown in FIG. 2D, after the insulating isolation film 105 is formed, polysilicon is deposited to a thickness of about 150 nm by CVD. The structure is heated to about 850° C. in the POCl$_3$ atmosphere to diffuse P. Subsequently, a WSi film is deposited to about 150 nm by sputtering to form a polycide film 106.

The insulating isolation film 105 has a three-layered structure of, e.g., SiO$_2$, SiN, and SiO$_2$. The polycide film 106 has a two-layered structure of polysilicon and WSi, as described above.

A resist mask is formed by known photolithography. The polycide film 106 is selectively removed by anisotropic etching such as RIE, thereby forming the control gates 106a and 106b, as shown in FIG. 2E.

When viewed from the upper side, the control gates 106a and 106b are formed as shown in FIG. 2E'. More specifically, the floating gate 104a is sandwiched by the pillar 101a and the control gate 106a. The floating gate 104b is sandwiched by the pillar 101a and the control gate 106b. The floating gate 104b is not present between the control gate 106a and the pillar 101a.

Figures 2F, 2G:
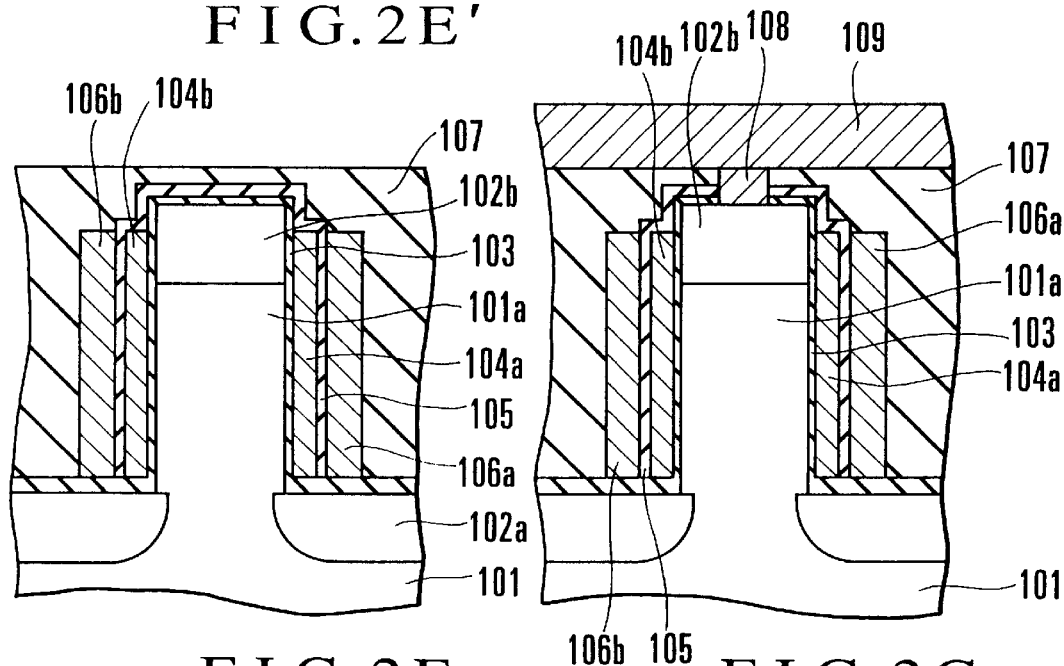

As shown in FIG. 2F, the insulating interlayer 107 is formed. A contact hole is formed on the pillar 101a, and then, a barrier metal consisting of titanium nitride is formed on the pillar 101a exposed to the bottom portion of the contact hole. After this, a plug 108 consisting of tungsten is buried, and an interconnection layer 109 of aluminum is formed. The interconnection layer 109 becomes bit lines.

With the above-described process, a flash memory in which one memory cell has the floating gates 104a and 104b having an area ratio of about 2:1 and the control gates 106a and 106b, respectively, is obtained.

As described above, in the first embodiment, two floating gates having different areas are formed in one memory cell. With this arrangement, a multilevel operation can be performed, as will be described below.

An erase operation will be described first. A potential of +16 V is applied to a terminal CG1 connected to the control gate 106a shown in FIGS. 1 and 3A, a potential of +16 V is applied to a terminal CG2 connected to the control gate 106b, and the source 102a, the drain 102b, and the semiconductor substrate 101 are set at 0 V, thereby performing an erase. When a voltage of about +16 V is applied to the control gates 106a and 106b, electrons are injected into both the floating gates 104a and 104b, and an erase state "11" is obtained, as shown in FIG. 3B. In the first embodiment, a state "00" wherein electrons are removed from all floating gates may be set as the erase state.

A write using a tunnel current when the erase state is "11" will be described next.

Figure 3A:
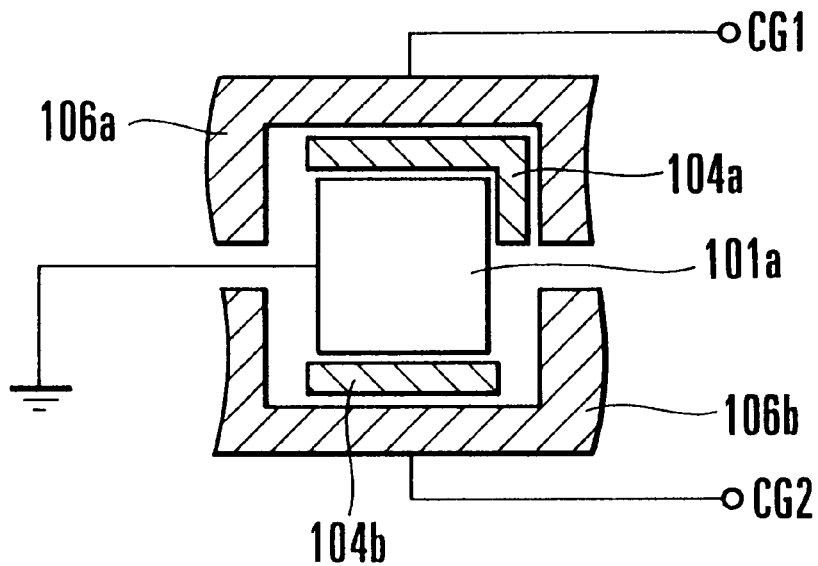
FIGS. 3A and 3B are explanatory views for explaining a data read and write from/in a memory cell in the present invention.
Figure 3B:
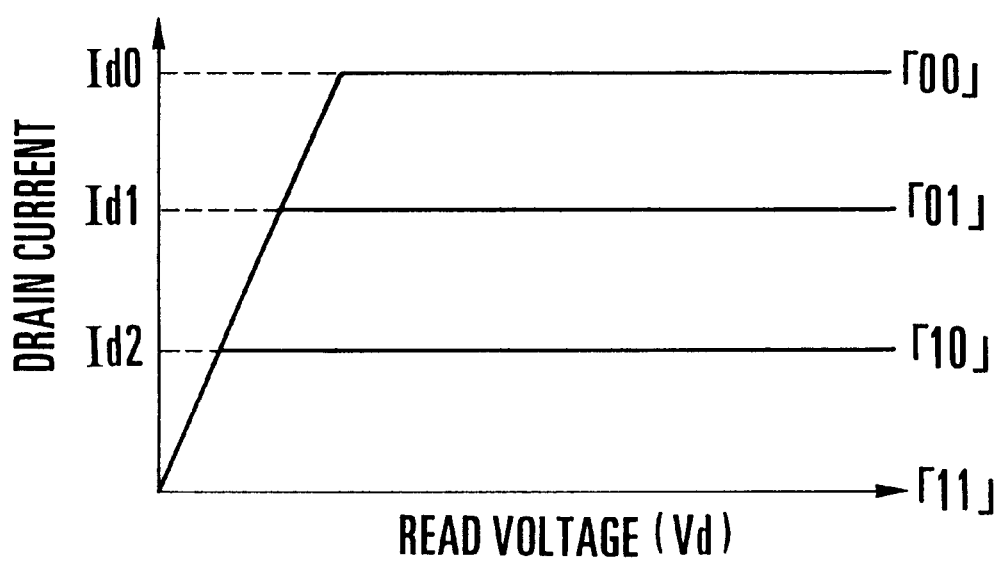

For example, to write data of level "0" only in the floating gate 104b shown in FIGS. 1 and 3A, a potential of +4 V is applied to the terminal CG1 connected to the control gate 106a, a potential of −9 V is applied to the terminal CG2 connected to the control gate 106b, and a potential of +4 V is applied to the drain 102b. The semiconductor substrate and the source 102a are set at 0 V. That is, by applying the potentials to the drain 102b and the control gate 106a, this memory cell is selected, and the potential difference between the control gate 106b and the drain 102b is maximized while that between the control gate 106a and the drain 102b is made smaller. As a result, electrons are removed only from the floating gate 104b to the semiconductor substrate side, and a write state "10" is obtained, as shown in FIG. 3B.

To write data of level "0" only in the floating gate 104a, a potential of −9 V is applied to the terminal CG1, a potential of +4 V is applied to the terminal CG2, and a potential of +4 V is applied to the drain 102b. The semiconductor substrate and the source 102a are set at 0 V. As a result, electrons are removed only from the floating gate 104a to the semiconductor substrate 101 side, and a write state "01" is obtained, as shown in FIG. 3B.

To write data of level "0" in both the floating gates 104a and 104b, a potential of −9 V is applied to the terminal CG1, a potential of −9 V is applied to the terminal CG2, and a potential of +4 V is applied to the drain 102b. The semiconductor substrate 101 and the source 102a are set at 0 V. As a result, electrons are removed from the floating gates 104a and 104b to the semiconductor substrate side, and a write state "00" is obtained, as shown in FIG. 3B.

Even when the erase state is "00", the write using a tunnel current is allowed.

In a read, a potential of 3.3 V is applied to the control gates 106a and 106b while setting the drain voltage at 1 V. As shown in FIG. 3B, when "00" is written in the memory cell, a drain current Id0 is obtained. When "11" is written in the memory cell, no drain current flows.

Since the floating gate 104a is larger in the area than the floating gate 104b, the drain current changes between the state "01" and the state "10". When "01" is written in the memory cell, a drain current Id1 is obtained. When "10" is written in the memory cell, a drain current Id2 is obtained.

A write using hot electrons when the erase state is "00" will be described next. For example, to write data of level "1" only in the floating gate 104b, a potential of 0 V is applied to the terminal CG1 connected to the control gate 106a, a potential of 12 V is applied to the terminal CG2 connected to the control gate 106b, and a potential of 6 V is applied to the drain 102b. The semiconductor substrate 101 and the source 102a are set at 0 V (FIG. 3A). That is, by applying the potentials to the drain 102b and the control gate 106b, this memory cell is selected, and the potential difference between the control gate 106b and the pillar 101a (substrate) is maximized while that between the control gate 106a and the drain 102b is made smaller. As a result, electrons are injected only into the floating gate 104b, and the write state "01" is obtained, as shown in FIG. 3B.

To write data of level "1" only in the floating gate 104a, a potential of 12 V is applied to the terminal CG1, a potential of 0 V is applied to the terminal CG2, and a potential of 6 V is applied to the drain 102b. The semiconductor substrate 101 and the source 102a are set at 0 V. As a result, electrons are injected only into the floating gate 104a, and the write state "10" is obtained, as shown in FIG. 3B.

To write data of level "1", in both the floating gates 104a and 104b, a potential of 12 V is applied to the terminal CG1, a potential of 12 V is applied to the terminal CG2, and a potential of 6 V is applied to the drain 102b. The semiconductor substrate 101 and the source 102a are set at 0 V. As a result, electrons are injected into the floating gates 104a and 104b, and a write state "11" is obtained, as shown in FIG. 3B.

As described above, according to the first embodiment, quarternary data can be stored in one memory cell. Therefore, the amount of information to be stored can be increased without increasing the number of memory cells.

Since multilevel data is realized by the structure of the memory cell itself, the multilevel data need not be realized by the circuit operation, so the load on the peripheral circuits decreases.

In the nonvolatile semiconductor memory device according to the first embodiment, the two sets of floating gates and control gates are not arranged in the direction of source and drain. Since no gap is formed between the two floating gates in the direction of source and drain, the channel resistance can be prevented from increasing.

In the first embodiment, write control is performed at the drain and the control gates. For this reason, write control can be performed with a small current. In addition, since the source can be shared by adjacent memory cells, they need not be isolated from each other.

In the first embodiment, contents of the two floating gates prepared in one memory cell can be read at once, so the read rate can be increased.

In the first embodiment, the two floating gates prepared in one memory cell have different areas. However, the present invention is not limited to this. Two floating gates having the same area may be formed in one memory cell. In this case, the same drain current flows in correspondence with data "01" and "10" in the read, so ternary data can be stored in one memory cell.

In the first embodiment, when the ratio of the areas of the two floating gates is set at 1:2, a more stable read can be performed. This is because when the areas of the two floating gates have a ratio of 1:2, the read drain current differences for "00", "01", "10", and "11" can be set at an equal interval.

Second Embodiment

A nonvolatile semiconductor memory device according to the second embodiment of the present invention will be described below.

In the second embodiment, as shown in FIGS. 4A and 4B, a gate insulating film 503 is formed around a columnar portion (pillar: channel portion) 501a formed on a p-type semiconductor substrate 501, and floating gates 504a and 504b are formed on the side surfaces of the gate insulating film 503.

In the second embodiment, a source 502a is formed in the semiconductor substrate 501 around the formation portion of the pillar 501a. At the upper portion of the pillar 501a, a drain 502b is formed on the floating gate 504a side, and a drain 502b' is formed on the floating gate 504b side. That is, in the second embodiment, the drain is divided at the upper portion of the pillar 501a.

Additionally, in the second embodiment, a control gate 506 as a word line is formed around the floating gates 504a and 504b via an insulating isolation film 505, and the upper peripheral portion of the control gate 506 is covered with an insulating interlayer 507. That is, in the second embodiment, one control gate is formed around the pillar 501a without being divided.

As shown in the plan view of FIG. 4B, on the insulating interlayer 507, bit lines 509a and 509b are connected to the drains 502b and 502b' via contact plugs 508a and 508b, respectively. In the second embodiment as well, the floating gate 504a has a larger area than the floating gate 504b. FIG. 4A shows a section taken along a line A–A' in FIG. 4B.

As described above, in the second embodiment, a flash memory in which one memory cell has the floating gates 504a and 504b having an area ratio of about 2:1 and the drains 502b and 502b', respectively, is obtained.

In the second embodiment as well, one memory cell has two floating gates having different areas, as in the first embodiment, so a multilevel operation can be performed, as will be described below.

An erase operation will be described first. For example, a voltage of 16 V is applied to the control gate 506 shown in FIG. 4B, and the source 502a, the two drains 502b and 502b', and the semiconductor substrate 501 are set at 0 V, thereby performing an erase operation.

When a voltage of about 16 V is applied to the control gate, electrons are injected into both the drains 502b and 502b', and an erase state "11" is obtained, as shown in FIG. 3B. In the second embodiment as well, a state "00" wherein electrons are removed from all floating gates may be set as the erase state, as in the first embodiment.

A write using a tunnel current when the erase state is "11" will be described next.

For example, to write data of level "0" only in the floating gate 504b, a potential of – 9 V is applied to the control gate 506, and a potential of + 4 V is applied to the drain 502b', i.e., the bit line 509b. The semiconductor substrate 501, the source 502a, and the drain 502b are set at 0 V. That is, by applying the potentials to the drain 502b' and the control gate 506, this memory cell is selected, and the potential difference between the control gate 506 and the drain 502b' is maximized. As a result, electrons are removed only from the floating gate 504b to the semiconductor substrate 501 side, and a write state "10" is obtained, as shown in FIG. 3B.

To write data of level "0" only in the floating gate 504a, a potential of – 9 V is applied to the control gate 506, and a potential of + 4 V is applied to the drain 502b. The semiconductor substrate 501, the source 502a, and the drain 502b' are set at 0 V. As a result, electrons are removed only from the floating gate 504a to the semiconductor substrate 501 side, and a write state "01" is obtained, as shown in FIG. 3B.

To write data of level "0" in both the floating gates 504a and 504b, a potential of – 9 V is applied to the control gate 506, and a potential of – 4 V is applied to the drains 502b and 502b'. The semiconductor substrate 501 and the source 502a are set at 0 V. As a result, electrons are removed from the floating gates 504a and 504b to the semiconductor substrate 501 side, and a write state "00" is obtained, as shown in FIG. 3B.

Even when the erase state is "00", the write using a tunnel current is allowed.

In a read, a potential of 3.3 V is applied to the control gate 506 while setting the drain voltage at 1 V and the source voltage at 0 V. As shown in FIG. 3B, when "00" is written in the memory cell, a drain current Id0 is obtained. When "11" is written in the memory cell, no drain current flows.

Since the floating gate 504a is larger in the area than the floating gate 504b, the drain current changes between the state "01" and the state "10". When "01" is written in the memory cell, a drain current Id1 is obtained. When "10" is written in the memory cell, a drain current Id2 is obtained.

As described above, according to the second embodiment as well, quarternary data can be stored in one memory cell. Therefore, the amount of information to be stored can be increased without increasing the number of memory cells.

In the second embodiment as well, since multilevel data is realized by the structure of the memory cell itself, the multilevel data need not be realized by the circuit operation, so the load on the peripheral circuits can be decreased.

In the nonvolatile semiconductor memory device according to the second embodiment as well, the two sets of floating gates and control gates are not arranged in the direction of source and drain. Since no gap is formed between the two floating gates in the direction of source and drain, the channel resistance can be prevented from increasing.

Since the source can be shared by adjacent memory cells, they need not be isolated from each other.

In the second embodiment, contents of the two floating gates prepared in one memory cell can be read at once by arranging a read sense amplifier (not shown) on the source side, so the read rate can be increased.

In the second embodiment, the two floating gates prepared in one memory cell have different areas. However, the present invention is not limited to this. Two floating gates having the same area may be formed in one memory cell.

In this case, the same drain current flows in correspondence with data "01" and "10" in the read, so ternary data can be stored in one memory cell. However, when two read sense amplifiers are arranged on the drain side, the contents of the two floating gates prepared in one memory cell can be independently read. Therefore, even when the floating gates have the same area, quarternary data (binary data×2FG) can be determined.

In the second embodiment as well, when the ratio of the areas of the two floating gates is set at 1:2, a more stable read can be performed. This is because when the areas of the two floating gates have a ratio of 1:2, the read drain current differences for "00", "01", "10", and "11" can be set at an equal interval.

Third Embodiment

A nonvolatile semiconductor memory device according to the third embodiment of the present invention will be described below.

Figure 5:
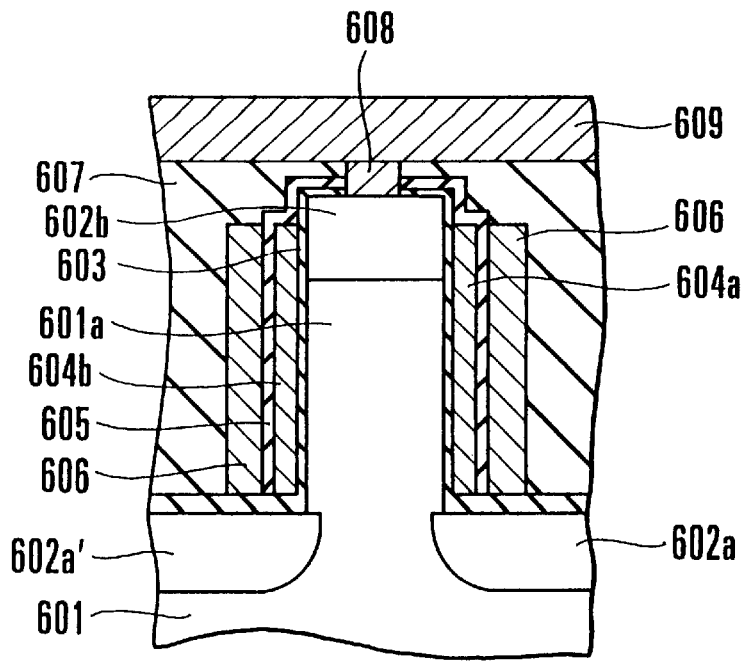
FIG. 5 is a sectional and view schematically showing the structure of a nonvolatile semiconductor memory device according to the third embodiment of the present invention.

In the third embodiment, as shown in FIG. 5, a gate insulating film 603 is formed around a columnar portion (pillar: channel portion) 601a formed on a p-type semiconductor substrate 601, and floating gates 604a and 604b are formed on the side surfaces of the gate insulating film 603. This is the same as in the first and second embodiments.

In the third embodiment, in the semiconductor substrate 601 around the formation portion of the pillar 601a, a source 602a is formed on the floating gate 604a side, and a source 602a' is formed on the floating gate 604b side. That is, in the third embodiment, the source is divided.

A drain 602b is formed at the upper portion of the pillar 601a.

Additionally, in the third embodiment, a control gate 606 as a word line is formed around the floating gates 604a and 604b via an insulating isolation film 605, and the upper peripheral portion of the control gate 606 is covered with an insulating interlayer 607. That is, in the third embodiment, one control gate is formed around the pillar 601a without being divided.

On the insulating interlayer 607, a bit line 609 is connected to the source 602a through a contact plug 608. In the third embodiment as well, the floating gate 604a has a larger area than the floating gate 604b.

As described above, in the third embodiment, a flash memory in which one memory cell has the floating gates 604a and 604b having an area ratio of about 2:1 and the sources 602a and 602a', respectively, is obtained.

In the third embodiment as well, one memory cell has two floating gates having different areas, as in the first and second embodiments, so a multilevel operation can be performed, as will be described below.

An erase operation will be described first. For example, a voltage of 16 V is applied to the control gate 606 shown in FIG. 5, and the two sources 602a and 602a', the drain 602b, and the semiconductor substrate 601 are set at 0 V, thereby performing an erase operation. When a voltage of about 16 V is applied to the control gate 606, electrons are injected into both the floating gates 604a and 604b, and an erase state "11" is obtained, as shown in FIG. 3B. In the third embodiment as well, a state "00" wherein electrons are removed from all floating gates may be set as the erase state, as in the first and second embodiments.

A write using a tunnel current when the erase state is "11" will be described next.

For example, to write data of level "0" only in the floating gate 604b, a potential of − 9 V is applied to the control gate 606, and a potential of + 4 V is applied to the source 602a'. The drain 602b, i.e., the bit line 609, the semiconductor substrate 601, and the source 602a are set at 0 V. That is, by applying the potentials to the source 602a' and the control gate 606, this memory cell is selected, and the potential difference between the control gate 606 and the source 602a' is maximized. As a result, electrons are removed only from the floating gate 604b to the semiconductor substrate 601 side, and a write state "10" is obtained, as shown in FIG. 3B.

To write data of level "0" only in the floating gate 604a, a potential of − 9 V is applied to the control gate 606, and a potential of + 4 V is applied to the source 602a. The drain 602b, the semiconductor substrate 601, and the source 602a' are set at 0 V. As a result, electrons are removed only from the floating gate 604a to the semiconductor substrate 601 side, and a write state "01" is obtained, as shown in FIG. 3B.

To write data of level "0" in both the floating gates 604a and 604b, a potential of − 9 V is applied to the control gate 606, and a potential of + 4 V is applied to the sources 602a and 602a'. The drain 602b and the semiconductor substrate 601 are set at 0 V. As a result, electrons are removed from the floating gates 604a and 604b to the semiconductor substrate 601 side, and a write state "00" is obtained, as shown in FIG. 3B.

Even when the erase state is "00", the write using a tunnel current is allowed.

In a read, a potential of 3.3 V is applied to the control gate 606 while setting the drain voltage at 1 V. As shown in FIG. 3B, when "00" is written in the memory cell, a drain current Id0 is obtained. When "11" is written in the memory cell, no drain current flows.

Since the floating gate 604a is larger in the area than the floating gate 604b, the drain current changes between the state "01" and the state "10". When "01" is written in the memory cell, a drain current Id1 is obtained. When "10" is written in the memory cell, a drain current Id2 is obtained.

As described above, according to the third embodiment as well, quarternary data can be stored in one memory cell. Therefore, the amount of information to be stored can be increased without increasing the number of memory cells.

In addition, since multilevel data is realized by the structure of the memory cell itself, the multilevel data need not be realized by the circuit operation, so the load on the peripheral circuits decreases.

In the nonvolatile semiconductor memory device according to the third embodiment as well, the two sets of floating gates and control gates are not arranged in the direction of source and drain. Since no gap is formed between the two floating gates in the direction of source and drain, the channel resistance can be prevented from increasing.

In the third embodiment, contents of the two floating gates prepared in one memory cell can be read at once by arranging a read sense amplifier (not shown) on the drain side, so the read rate can be increased.

In the third embodiment, the two floating gates prepared in one memory cell have different areas. However, the present invention is not limited to this. Two floating gates having the same area may be formed in one memory cell.

In this case, the same drain current flows in correspondence with data "01" and "10" in the read, so ternary data can be stored in one memory cell. However, when two read sense amplifiers are arranged on the source side, the contents of the two floating gates prepared in one memory cell can be independently read. Therefore, even when the floating gates have the same area, quarternary data (binary data×2FG) can be determined.

In the third embodiment as well, when the ratio of the areas of the two floating gates is set at 1:2, a more stable read can be performed. This is because when the areas of the two floating gates have a ratio of 1:2, the read drain current differences for "00", "01", "10", and "11" can be set at an equal interval.

Fourth Embodiment

A nonvolatile semiconductor memory device according to the fourth embodiment of the present invention will be described below.

Figure 6:
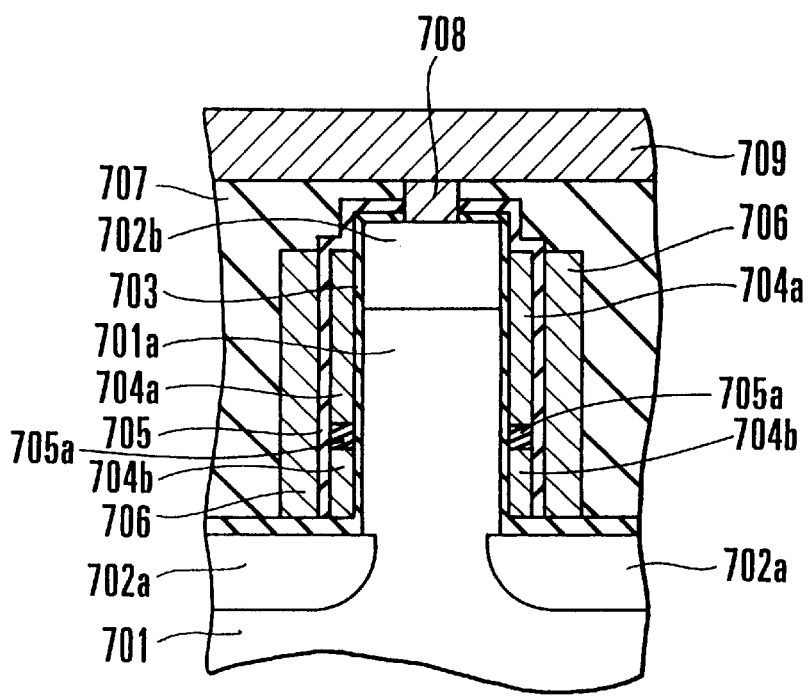
FIG. 6 is a sectional and view schematically showing the structure of a nonvolatile semiconductor memory device according to the fourth embodiment of the present invention.

In the fourth embodiment, as shown in FIG. 6, a gate insulating film 703 is formed around a columnar portion (pillar: channel portion) 701a formed on a p-type semiconductor substrate 701. A floating gate 704a is formed at the upper portion around the gate insulating film 703, and a floating gate 704b is formed at the lower portion around the gate insulating film 703.

That is, in the fourth embodiment, the floating gate 704b is formed at the lower portion of the pillar 701a to surround the pillar 701a. The floating gate 704a is formed at the upper portion of the pillar 701a to surround the pillar 701a. The floating gates 704a and 704b are insulated from each other via insulating film 705a.

A source 702a is formed in the semiconductor substrate 701 around the pillar 701a. A drain 702b is formed at the upper portion of the pillar 701a. A control gate 706 as a word line is formed around the floating gates 704a and 704b via an insulating isolation film 705. The upper peripheral portion of the control gate 706 is covered with an insulating interlayer 707.

That is, in the fourth embodiment, one control gate is formed around the pillar 701a without being divided.

On the insulating interlayer 707, a bit line 709 is connected to the drain 702b through a contact plug 708. In the fourth embodiment as well, the floating gate 704a has a larger area than the floating gate 704b.

As described above, a flash memory in which one memory cell has the floating gates 704a and 704b divided in a direction perpendicular to the plane of the semiconductor substrate 701 and having an area ratio of about 2:1 is obtained.

In the fourth embodiment as well, one memory cell has two floating gates having different areas, as in the first embodiment, so a multilevel operation can be performed, as will be described below.

An erase operation will be described first. A voltage of 16 V is applied to the control gate 706 shown in FIG. 6, and the source 702a, the drain 702b, and the semiconductor substrate 701 are set at 0 V, thereby performing an erase operation. When a voltage of about 16 V is applied to the control gate 706, electrons are injected into both the floating gates 704a and 704b, and an erase state "11" is obtained, as shown in FIG. 3B. In the fourth embodiment as well, a state "00" wherein electrons are removed from all floating gates may be set as the erase state, as in the first embodiment.

A write using a tunnel current when the erase state is "11" will be described next.

For example, to write data of level "0" only in the floating gate 704b, a potential of − 9 V is applied to the control gate 706, a potential of − 4 V is applied to the drain 702b, i.e., the bit line 709, and a potential of + 4 V is applied to the source 702a. The semiconductor substrate 701 is set at 0 V. That is, by applying the potentials to the drain 702b and the control gate 706, this memory cell is selected, and the potential difference between the control gate 606 and the source 702a is maximized. As a result, electrons are removed only from the floating gate 704b to the semiconductor substrate 701 side, and a write state "10" is obtained, as shown in FIG. 3B.

To write data of level "0" only in the floating gate 704a, a potential of − 9 V is applied to the control gate 706, a potential of + 4 V is applied to the drain 702b, and a potential of − 4 V is applied to the source 702a. The semiconductor substrate 701 is set at 0 V. As a result, electrons are removed only from the floating gate 704a to the semiconductor substrate 701 side, and a write state "01" is obtained, as shown in FIG. 3B.

To write data of level "0" in both the floating gates 704a and 704b, a potential of − 9 V is applied to the control gate 706, and a potential of + 4 V is applied to the source 702a and the drain 702b. The semiconductor substrate 701 is set at 0 V. As a result, electrons are removed from the floating gates 704a and 704b to the semiconductor substrate 701 side, and a write state "00" is obtained, as shown in FIG. 3B.

Even when the erase state is "00", the write using a tunnel current is allowed.

In a read, a potential of 3.3 V is applied to the control gate 706 while setting the drain voltage at 1 V. As shown in FIG. 3B, when "00" is written in the memory cell, a drain current Id0 is obtained. When "11" is written in the memory cell, no drain current flows.

Since the floating gate 704a is larger in the area than the floating gate 704b, the drain current changes between the state "01" and the state "10". When "01" is written in the memory cell, a drain current Id1 is obtained. When "10" is written in the memory cell, a drain current Id2 is obtained.

As described above, according to the fourth embodiment as well, quarternary data can be stored in one memory cell. Therefore, the amount of information to be stored can be increased without increasing the number of memory cells.

In addition, since multilevel data is realized by the structure of the memory cell itself, the multilevel data need not be realized by the circuit operation, so the load on the peripheral circuits decreases.

In the fourth embodiment, contents of the two floating gates prepared in one memory cell can be read at once, so the read rate can be increased.

In the fourth embodiment, the two floating gates prepared in one memory cell have different areas. However, the present invention is not limited to this. Two floating gates having the same area may be formed in one memory cell.

In this case, if the channels of the two floating gates have the same impurity concentration, the same drain current flows in correspondence with data "01" and "10" in the read, so ternary data can be stored in one memory cell. Even when the floating gates have the same area, quarternary data can be stored by changing the impurity concentrations of the two channels.

In the fourth embodiment as well, when the ratio of the areas of the two floating gates is set at 1:2, a more stable read can be performed. This is because when the areas of the two floating gates have a ratio of 1:2, the read drain current differences for "00", "01", "10", and "11" can be set at an equal interval.

Fifth Embodiment

A nonvolatile semiconductor memory device according to the fifth embodiment of the present invention will be described below.

A method of manufacturing the memory cell will be described first.

Figure 7A:
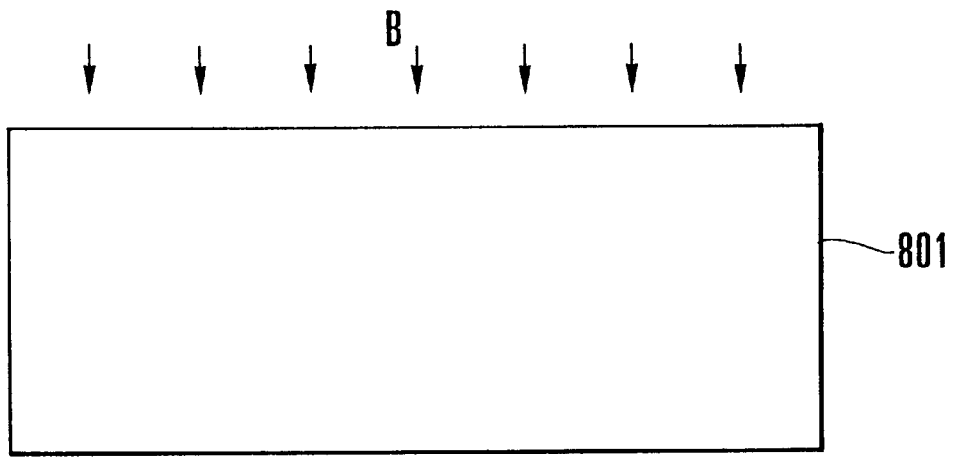
FIGS. 7A to 7H are explanatory views showing a method of manufacturing a nonvolatile semiconductor memory device according to a fifth embodiment of the present invention.
Figure 7B:
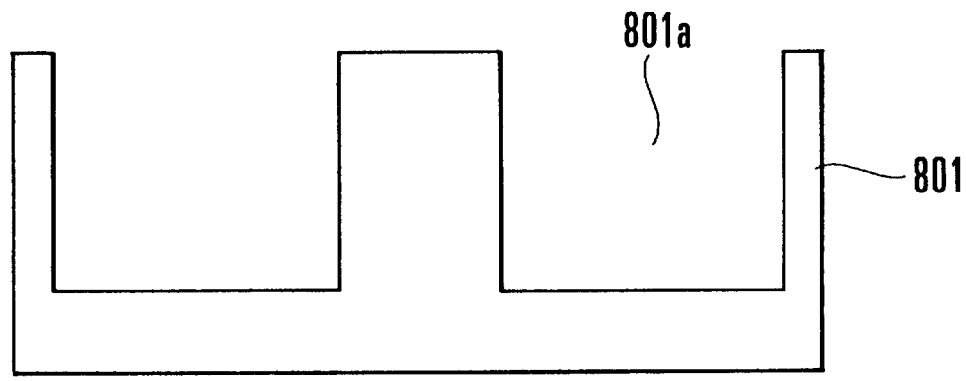
Figure 7C:
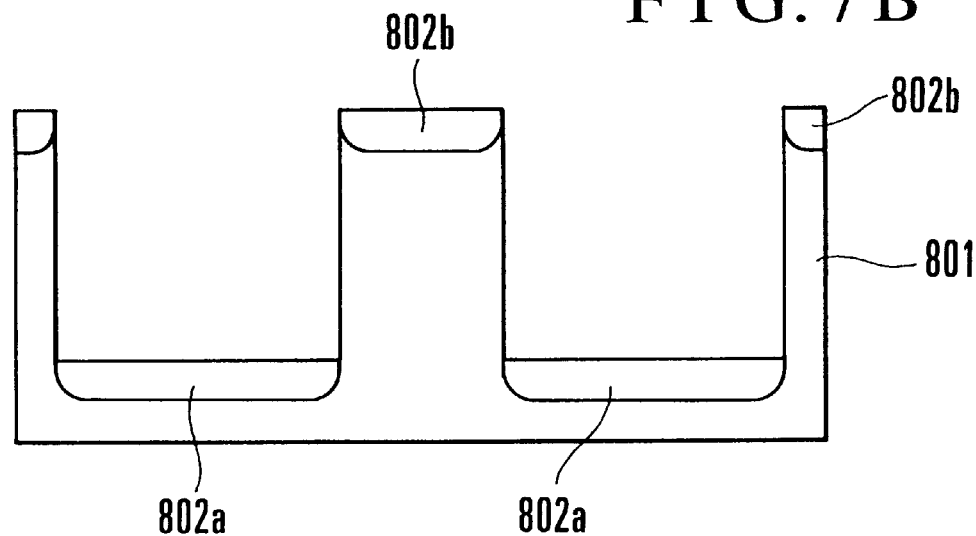

As shown in FIG. 7A, B is ion-implanted into a semiconductor substrate 801 to form a p-type semiconductor substrate. As shown in FIG. 7B, the semiconductor substrate 801 is dry-etched at predetermined positions to form holes 801a. For example, As is ion-implanted at 70 keV and $5 \times 10^{15}$ cm$^{-2}$ to form sources 802a and drains 802b (FIG. 7C). After ion implantation, the resultant structure is heated to 950° C. in a vapor atmosphere to form an oxide film having a thickness of about 40 nm. With this process, the sources 802a and the drains 802b, each having an impurity concentration of about $10^{20}$ cm$^{-3}$, are formed.

Figure 7D:
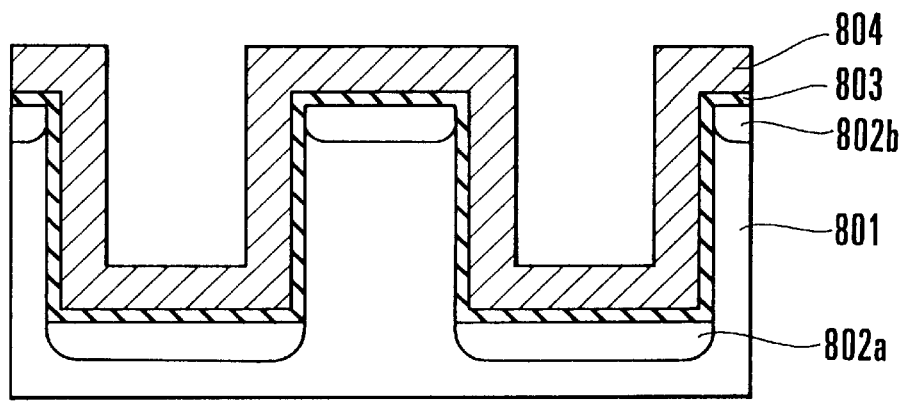

After the oxide film is removed, the structure is heated to 850° C. in the vapor atmosphere to form a gate insulating film 803 having a thickness of about 80 nm, as shown in FIG. 7D. Polysilicon is deposited on the gate insulating film 803 to a thickness of about 150 nm by CVD. The resultant structure is heated to about 850° C. in a POCl$_3$ atmosphere to diffuse P, thereby forming a polysilicon film 804 doped with P as an impurity.

Figure 7E:
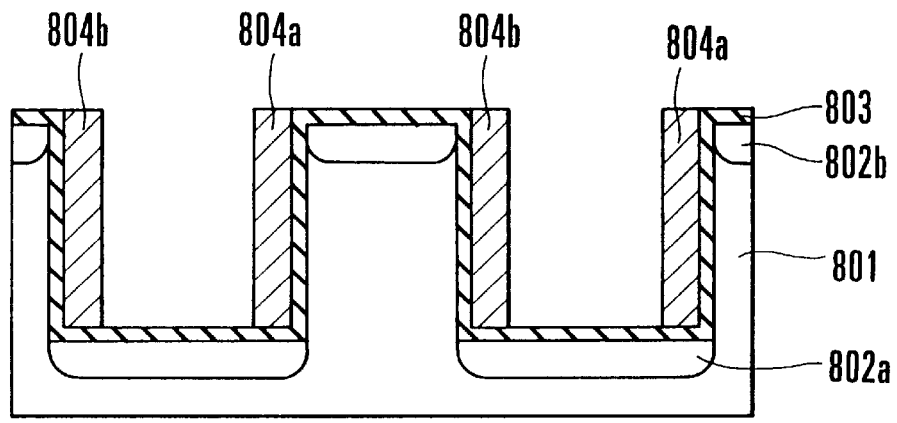

A resist mask is formed by known photolithography. The polysilicon film 804 is selectively removed by anisotropic etching such as RIE to form floating gates 804a and 804b on the inner wall of each hole 801a via the gate insulating film 803, as shown in FIG. 7E. Note that the floating gate 804a has a larger area than the floating gate 804b.

Figure 7F:
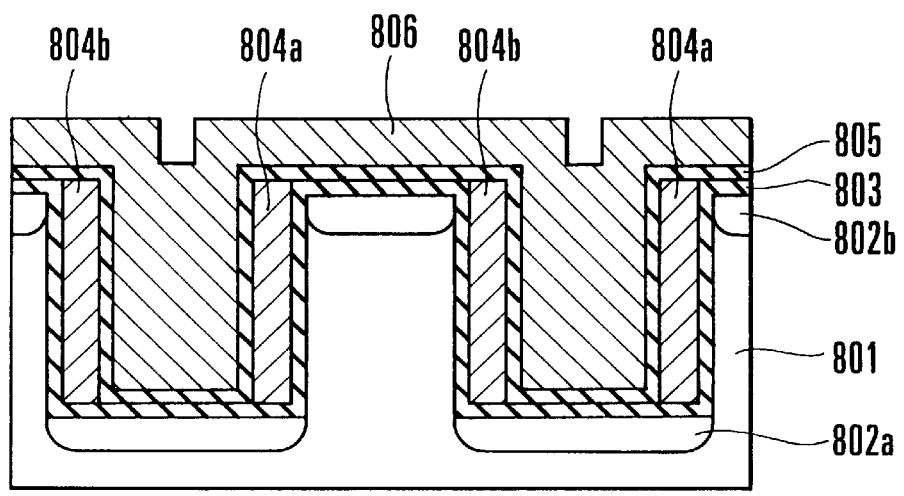

As shown in FIG. 7F, after an insulating isolation film 805 is formed, polysilicon is deposited to a thickness of about 150 nm by CVD. The structure is heated to about 850° C. in the POCl$_3$ atmosphere to diffuse P. Subsequently, a WSi film is deposited to about 150 nm by sputtering to form a polycide film 806. The insulating isolation film 805 has a three-layered structure of, e.g., SiO$_2$, SiN, and SiO$_2$. The polycide film 806 has a two-layered structure of polysilicon and WSi, as described above.

Figure 7G:
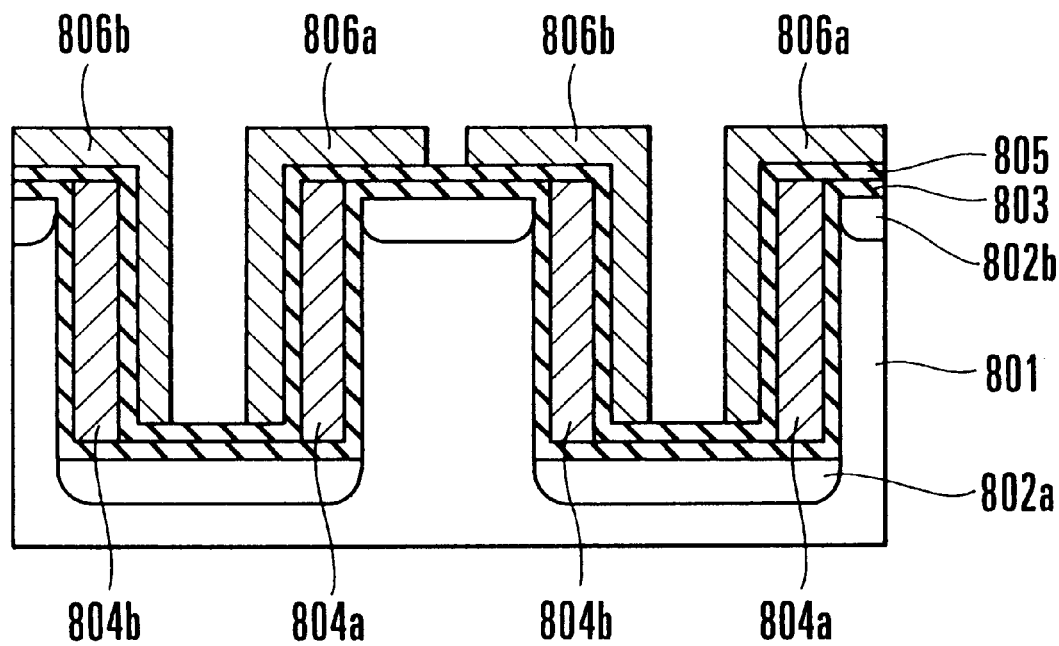

A resist mask is formed by known photolithography. The polycide film 806 is selectively removed by anisotropic etching such as RIE, thereby forming control gates 806a and 806b, as shown in FIG. 7G.

Figure 7H:
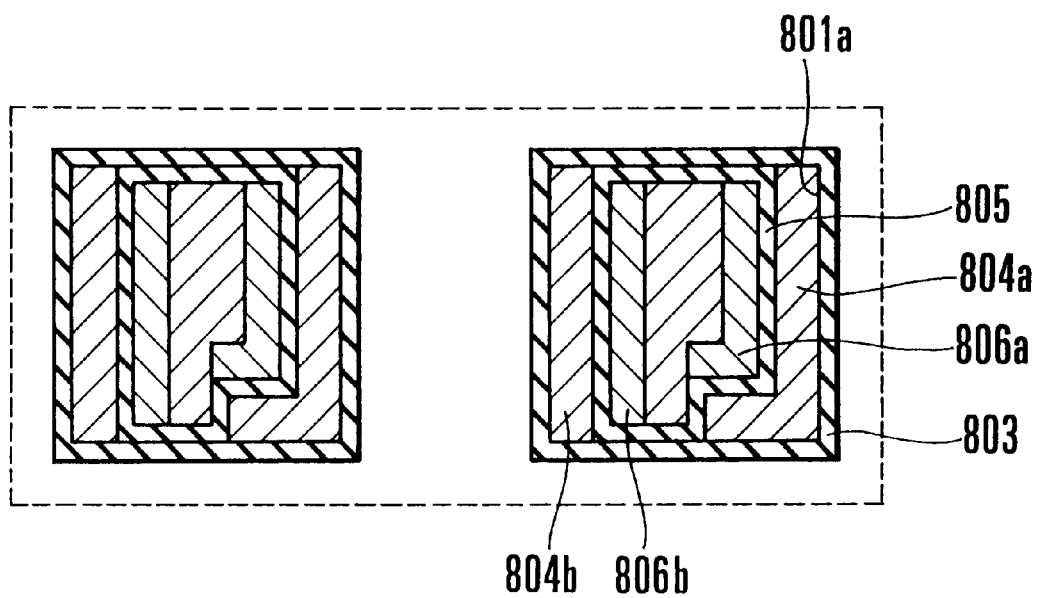
Figure 8A:
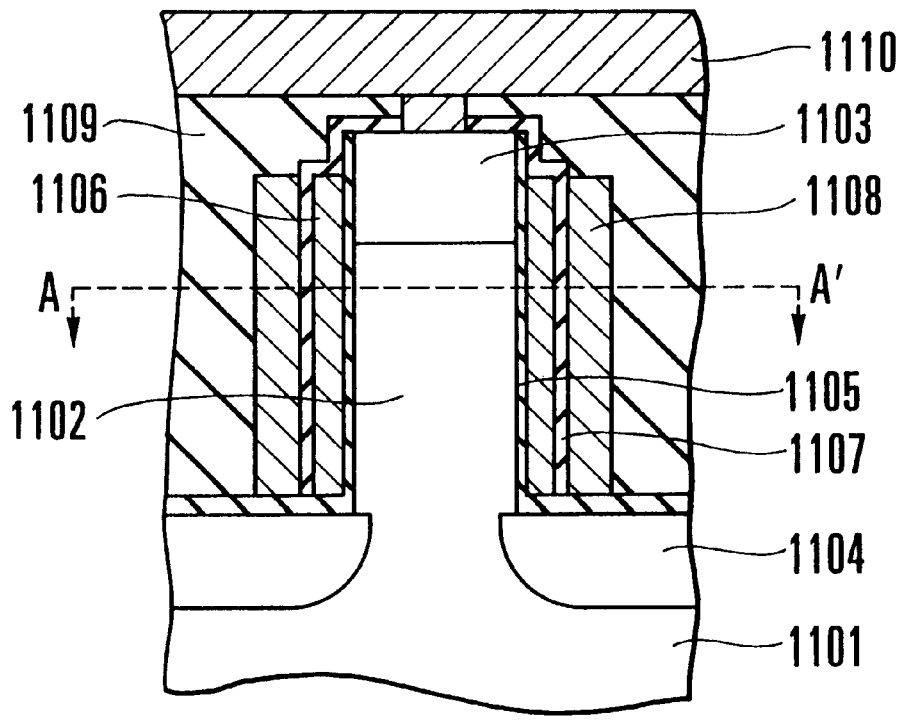
FIGS. 8A and 8B are sectional and plan views, respectively, showing the schematic structure of a conventional nonvolatile semiconductor memory device.
Figure 8B:
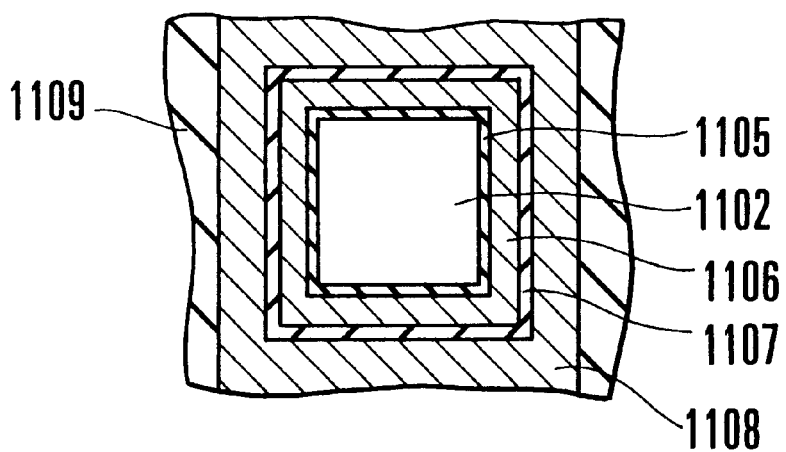

The floating gates 804a and 804b and the control gates 806a and 806b have two-dimensional shapes as shown in FIG. 7H. The floating gate 804a is sandwiched by the inner wall of the hole 801a and the control gate 806a while the floating gate 804b is sandwiched by the inner wall of the hole 801a and the control gate 806b. The floating gate 804b is not present between the control gate 806a and the inner wall of the hole 801a.

After the control gates 806a and 806b are formed, as described above, and a flat insulating interlayer is formed on the structure, a bit line is connected to the drain 802b, and word lines are connected to the control gates 806a and 806b, respectively.

With the above-described process, a flash memory in which one memory cell has the floating gates 804a and 804b having an area ratio of about 2:1 and the control gates 806a and 806b, respectively, is obtained, as in the first to fifth embodiments.

In the fifth embodiment as well, one memory cell has two floating gates having different areas, so a multilevel operation can be performed, as in the first embodiment. The same effect as in the first embodiment can be obtained. In the fifth embodiment as well, the two floating gates prepared in one memory cell have different areas. However, the present invention is not limited to this. Two floating gates having the same area may be formed in one memory cell. In this case, the same drain current flows in correspondence with data "01" and "10" in the read, so ternary data can be stored in one memory cell.

In the fifth embodiment, when the ratio of the areas of the two floating gates is set at 1:2, a more stable read can be performed. This is because when the areas of the two floating gates have a ratio of 1:2, the read drain current differences for "00", "01", "10", and "11" can be set at an equal interval.

As has been described above, according to the present invention, the nonvolatile semiconductor memory device comprises a vertical memory cell constituted by at least a channel portion vertically formed on a semiconductor substrate, a drain and a source formed at the upper and lower positions of the channel portion to form a channel at the channel portion, a first floating gate formed on part of the side portion of the channel portion via a gate insulating film, a second floating gate formed on the side portion of the channel portion in a region without the first floating gate, and a control gate formed outside the first and second floating gates via an insulating isolation film.

With this arrangement, two or more states can be formed in the channel formed at the channel portion depending on the presence/absence of electrons in the first and second floating gates.

Therefore, according to the present invention, ternary or more data can be stored in one memory cell, so the amount of information to be stored can be increased without increasing the number of memory cells. In addition, multilevel data is not realized by the circuit operation, the amount of charges to be stored in one floating gate need not be strictly controlled, so the load on the peripheral circuits of the memory cell does not increase.

Furthermore, according to the present invention, since contents of the two floating gates prepared in one memory cell can be read at once, the read rate can be increased.

What is claimed is:

1. A nonvolatile semiconductor memory device with a vertical memory cell said vertical memory cell comprising:
    a channel portion vertically formed on a semiconductor substrate;
    a drain and a source formed at upper and lower positions of said channel portion to form a channel in said channel portion;
    a first floating gate formed on part of a side portion of said channel portion via a gate insulating film;
    a second floating gate formed on the side portion of said channel portion in a region without said first floating gate; and
    a control gate formed outside said first and second floating gates via an insulating isolation film,
    wherein one of said first floating gate and said second floating gate has a larger area in contact with said gate insulating film than the other of said first floating gate and said second floating gate.

2. A device according to claim 1 wherein
    one of said first floating gate and said second floating gate has an area twice that of the other of said first floating gate and said second floating gate.

3. A device according to claim 1 wherein
    said first floating gate and second floating gate partially overlap said drain region on the side portion of said channel portion via said insulating film.

4. A device according to claim 1 wherein
    said drain comprises a first drain formed on a side of said first floating gate and a second drain formed on a side of said second floating gate.

5. A device according to claim 1 wherein
    said source comprises a first source formed on a side of said first floating gate and a second source formed on a side of said second floating gate.

6. A device according to claim 1 wherein said second floating gate is sandwiched by said first floating gate and said semiconductor substrate.

7. A device according to claim 1, wherein said control gate is a single gate which overlaps said first and second floating gates via said insulating isolation film.

8. A nonvolatile semiconductor memory device with a vertical memory cell said vertical memory cell comprising:
    a channel portion vertically formed on a semiconductor substrate;
    a drain and a source formed at upper and lower positions of said channel portion to form a channel in said channel portion;
    a first floating gate formed on part of a side portion of said channel portion via a gate insulating film;
    a second floating gate formed on the side portion of said channel portion in a region without said first floating gate; and
    a control gate formed outside said first and second floating gates via an insulating isolation film,
    wherein one of said first floating gate and said second floating gate has a larger area than the other of said first floating gate and said second floating gate, and
    wherein said control gate comprises
    a first control gate formed outside said first floating gate via said insulating isolation film, and
    a second control gate formed outside said second floating gate via said insulating isolation film.

9. A nonvolatile semiconductor memory device with a vertical memory cell, said vertical memory cell comprising:
    a channel portion vertically formed on a semiconductor substrate;
    a drain and a source formed at upper and lower positions of said channel portion to form a channel in said channel portion;
    a first floating gate formed on part of a side portion of said channel portion via a gate insulating film, said first floating gate surrounding said channel portion;
    a second floating gate formed on the side portion of said channel portion in a region without said first floating gate, said second floating gate surrounding said channel portion in said region without said first floating gate; and
    a control gate formed outside said first and second floating gates via an insulating isolation film,
    wherein said second floating gate is sandwiched by said first floating gate and said semiconductor substrate, and
    wherein one of said first floating gate and said second floating gate has a larger area in contact with said gate insulating film than the other of said first floating gate and said second floating gate.

10. A device according to claim 9, wherein one of said first floating gate and said second floating gate has an area twice that of the other of said first floating gate and said second floating gate.

11. A device according to claim 9, wherein said first floating gate partially overlaps said drain region on the side portion of said channel portion via said insulating film.

12. A device according to claim 9, wherein said control gate is a single gate which overlaps said first and second floating gates via said insulating isolation film.

* * * * *